United States Patent [19]
Saito et al.

[11] Patent Number: 5,150,047
[45] Date of Patent: Sep. 22, 1992

[54] MEMBER FOR USE IN ASSEMBLY OF INTEGRATED CIRCUIT ELEMENTS AND A METHOD OF TESTING ASSEMBLED INTEGRATED CIRCUIT ELEMENTS

[75] Inventors: Tamio Saito; Toshio Yamamoto; Naoharu Ohikata; Jiro Ono, all of Tokyo, Japan

[73] Assignee: Nippon Steel Corporation, Tokyo, Japan

[21] Appl. No.: 553,082

[22] Filed: Jul. 17, 1990

[30] Foreign Application Priority Data

Jul. 21, 1989 [JP] Japan .................... 1-190099
Jul. 31, 1989 [JP] Japan .................... 1-198685

[51] Int. Cl.$^5$ .................................................. G01R 31/28
[52] U.S. Cl. .............................. 324/158 R; 371/22.5; 437/8
[58] Field of Search ............ 324/158 F, 158 R, 73.1; 174/52.4; 437/8; 371/22.5, 22.6; 357/70, 80

[56] References Cited

U.S. PATENT DOCUMENTS

| | | | |
|---|---|---|---|
| 4,386,389 | 5/1983 | Proebsting ........................ | 361/406 |
| 4,772,936 | 9/1988 | Reding et al. .................... | 174/52.4 |
| 4,792,532 | 12/1988 | Ohtani et al. ..................... | 437/8 |
| 4,806,409 | 2/1989 | Walter et al. ..................... | 174/52.4 |
| 4,894,605 | 1/1990 | Ringleb et al. ................... | 324/537 |
| 5,008,614 | 4/1991 | Shreeve et al. .................. | 324/158 F |

FOREIGN PATENT DOCUMENTS

| | | |
|---|---|---|
| 107771 | 5/1984 | European Pat. Off. . |
| 295007 | 12/1988 | European Pat. Off. . |
| WO84/02580 | 7/1984 | World Int. Prop. O. . |
| WO89/09493 | 10/1989 | World Int. Prop. O. . |

OTHER PUBLICATIONS

IBM Technical Disclosure Bulletin, vol. 31, No. 4, Sep. 1988, pp. 30–31 "Testable TAB Tape with Inner Guard Ring".
Japan Semiconductor Yearbook 1988, pp. 402–405.
Nikkey Microdevice, Press Journal Co., Sep. 1987, pp. 99–106.

*Primary Examiner*—Ernest F. Karlsen
*Attorney, Agent, or Firm*—Pollock, Vande Sande & Priddy

[57] ABSTRACT

An apparatus for assembly and testing of an IC element having a first section designated for primary functions of the IC element and a second section designated for testing of the IC element, including a substrate made of a film of insulating material and having an IC-mounting portion defining a position of IC element to be assembled a plurality of first leads mounted on the substrate and connected to the first section of the IC element when mounted to the IC-mounting portion, a plurality of second leads connected to the second section of the IC element, a single first test pad for connection of the first leads thereto, second test pads for connection of the respective second leads thereto and circuit for connecting the first leads to at least one of the second leads for testing the IC element through the first and second pads.

9 Claims, 4 Drawing Sheets

MEMBER FOR USE IN ASSEMBLY OF INTEGRATED CIRCUIT ELEMENTS AND A METHOD OF TESTING ASSEMBLED INTEGRATED CIRCUIT ELEMENTS

BACKGROUND OF THE INVENTION

1. Field of the Invention

This invention relates to a device for use in assembly of integrated circuit elements or chips and to a method of testing assembled integrated circuit chips. In particular it relates to a device applied to a film carrier for use in mounting IC chips each having a self-test circuit provided therein onto, for example, a printed circuit board by the TAB (tape automated bonding) system, and to a method of testing the integrated circuit elements mounted on such device by use of the self-test circuits.

2. Description of the Related Art

One of known IC assembly techniques is the TAB system described in, for example, the Japan Semiconductor Yearbook of 1988 edition, pp. 402–405, and Nikkei Microdevice published by the Press Journal Co., September, 1987, pp. 99–106. This TAB system employs a film carrier or TAB tape. The TAB tape is made of a long and narrow film of an insulating material such as polyimide, glass, epoxy resin, BT resin or polyester resin. The TAB tape has sprocket holes formed at equal intervals along both edges in the lengthwise direction to be used as indices in working process, and it is divided lengthwise into a number of frames, each corresponding to one IC chip to be mounted. Each frame has a number of conductive leads of a predetermined pattern formed at equal intervals on one surface. These conductive leads can be formed by photo-etching a foil of a conductive material such as copper or copal adhered to the insulating film, into a certain pattern. These conductive leads may also be formed by a plating technique such as non-electrolytic plating technique or by an electrodeposition technique.

The IC chips bonded to the TAB tape must be subjected to a test of the functions of the chips and that of the electrical connections between respective pads on each chip and the corresponding conductive leads on the TAB tape. A known method of testing the IC chip bonded on the TAB tape employs a test socket such as TAB socket made by Sumitomo 3M. By this method, both the functions of the IC chip and the electrical connections between the IC chip and the conductive leads can be tested at a time.

In another known method, a prober is used for testing the IC chips bonded to the TAB tape without use of such test socket. In this method, the test of the electrical characteristics and operating characteristics of each of the IC chips is carried out by locating the prober (probes for transmitting and receiving test signals) in direct contact with the test pads. This method can also detect the defective bonding between the pads of IC chip and the leads similarly to the method using the test socket.

As one of the methods other than the test methods of IC chip carried out after it is bonded to the TAB tape, there is known a scan test method for testing the operation of the IC chip before it is bonded to the TAB tape. According to this method, the IC chip is previously formed with a scan test circuit in addition to the circuits for the primary functions of the IC chip, and the test is carried out by operating the scan test circuit so as to turn on or off (scanning) in a predetermined sequence the switching gates provided between the IC pads, on which the bumps for bonding are formed, and the internal circuits. This method does not require bringing the test prober in contact with all the IC pads. That is, the test prober is brought in contact with only a small number of IC pads (for example, 10 IC pads of an IC with 200 pins), and the scan circuit is used to switch the switching gates thereby making a test having the same effects as those obtained by locating the prober in contact with all the IC pads. However, after the IC pads are bonded to the corresponding leads of the TAB tape, it is necessary to additionally test the connection between, the pads and the leads.

In the method using the test socket, the contact pins of the test socket must be mechanically in contact with, the test pads on the TAB tape, and hence for the reliability of the test, results the test pads printed on the TAB tape must be spaced from each other by a certain distance. Increase of the distance between the test pads will necessarily require wider TAB tape, and hence much use of more TAB tape made of expensive polyimide, resulting in high cost.

More specifically, when the test pads are spaced from each other by 0.25 mm in an IC chip with 200 pins, it would be enough for the TAB tape to have width of 35 mm. However, for the reliability of the test, the interval between the test pads is required to be no less than 0.5 mm. In this case, the TAB tape must be 75 mm wide, thus increasing the cost of the TAB tape, and consequently the cost in assembly of each IC.

The assembly of IC having more than 200 pins involves various problems such as complicated wirings and construction of the leads and test pads to be printed on the TAB tape, as well as, the distance between the test pads. In addition, it becomes difficult to ensure that the contact pins and the test pads are securely in contact with each other. Particularly, due to the recent trend towards a large number of pins, it is expected that ICs having a great number of pins such as 300 pins, 500 pins and the like will be realized in the future. In that case, the problems of high cost of the TAB tape, the test socket and of the reliability of test will be serious.

The method of testing by use of the prober also involves similar problems such that the test equipment using the prober becomes a large scale, resulting in high test cost.

On the other hand, the scan test method is free from such problem, but since it is carried out before the IC chip is bonded, the connections between the IC pads and the leads of the TAB tape cannot be tested for checking any defects which may occur during bonding process.

SUMMARY OF THE INVENTION

Accordingly, it is a first object of this invention to provide a member for assembly of IC element having a large number of connection terminals and a self-test circuit incorporated therein, the member comprising a great number of conductive leads formed on its one surface and having inner end portions to be connected to connection terminals of the IC element, and a limited number of test pads, which number is not smaller than the number of the conductive leads of which the inner end portions are to be connected to the connection terminals associated with the test circuit, but irrespective of and less than the number of all the conductive leads of the IC element, wherein outer end portions of the conductive leads of which the inner end portions are to be connected to the connection terminals associated with the test circuit are selectively connected to the test pads so that electrical connections between the conductive leads and the connection terminals and/or the functions of the IC elements can be tested through the test pads, while the test pads are formed with a size of each pad and a space between any two pads large enough to assure the reliability of the test without increasing the space of a margin area of the member on which the test pads are provided, as compared with the prior art.

It is a second object of this invention to provide a method of testing the electrical connections between the connection terminals of the IC element mounted on the member of the above-mentioned type and the conductive leads.

According to a first embodiment of the present invention, to achieve the first object, there is provided a device for assembly of IC element having a large number of connection terminals and a self-test circuit incorporated therein. The device comprising: a substrate made of a film of insulating material and having a first portion for defining a position of an IC element to be assembled and a second portion surrounding the first portion; a large number of conductive leads mounted on the substrate and spaced from each other, the leads having, respective inner end portions positioned in the first portion for convenience of connection to the connection terminals of the IC element when the IC element is placed in the position defined. by the first portion and respective outer end portions positioned in the said second portion; and a plurality of test pads provided on the second portion and spaced from each other, wherein the number of the test pads is not smaller than the number of the connection terminals associated with the test circuit and less than the number of all the connection terminals of the IC element, the size of each test pad is at least larger than that of the outer end portion of the conductive lead, and any two of the test pads are spaced by a distance enough to assure reliability of the test when the IC element is tested through the test pads.

According to a second aspect of the present invention, to achieve the second object, there is provided a method of testing electrical connections between conductive leads of a device for assembly of IC element and connection terminals of the IC element, wherein the device comprises a substrate including a first portion for defining a position of the IC element to be assembled and a second portion surrounding the first portion and a large number of conductive leads spaced from each other and extending between their inner end portions positioned in the first portion and their outer end portions positioned in the second portion and the IC element is placed in the position defined by the first portion and have the connection terminals connected to the inner end portions of the conductive leads, respectively. The method comprises the steps of: providing the IC element preliminarily with switch means including first switches connected between internal circuits of the IC element and associated connection terminals, respectively, and second switches connected between a selected one of the connection terminals and the internal circuit-associated connection terminals, and a test circuit for driving the switch means so as to sequentially turn on or off the first and second switches at a predetermined sequence and timing, connecting the outer end portions of the conductive leads connected to the internal circuit-associated connection terminals together to a first test pad provided on the second portion; connecting the outer end portion of the conductive lead connected to the selected connection terminal to a second test pad provided on the second portion and judging electrical connection between each of the conductive leads and the corresponding connection terminal from electrical conduction between the first and second test pads while driving the switch means by the test circuit so as to cause the first and second switches to be turned on or off at the predetermined sequence and timing.

DESCRIPTION OF THE PREFERRED EMBODIMENTS

An embodiment of this invention applied to a TAB-system carrier film or a TAB tape will be described. As described above, this invention fundamentally intends to assure the reliability of test of an IC element or chip having a great number of connection terminals and a self-test circuit incorporated therein and mounted on the TAB tape with respect to the electrical connection between the connection terminals and the conductive leads of the TAB tape and/or the functions of IC chip, and thus the structure of the TAB tape is closely related to the method of testing the IC chip. The test for IC chips includes a test for the electrical connection between the connection terminals of the IC chip and the conductive leads of the TAB tape and a function test for the functions of the IC chip. Practically, both tests are normally necessary for each IC chip, and thus it is preferable to provide test pads on the TAB tape so as to facilitate both tests. However, the tests are carried out in different ways and the related test pads on the TAB tape are connected in different ways. The connection and function tests will be separately described.

Figure 3:
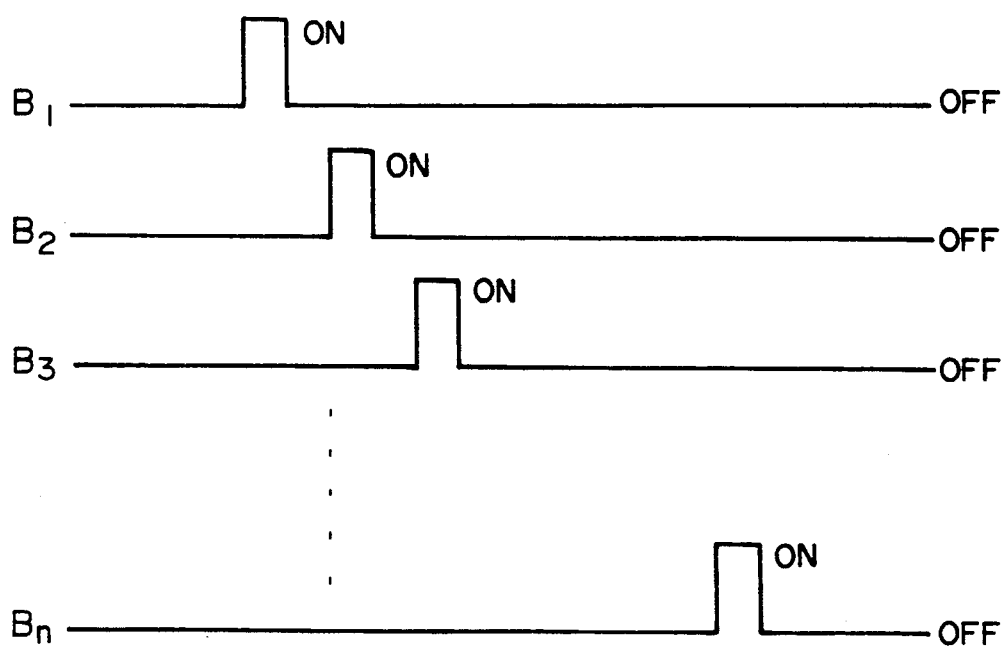
FIG. 3 is a timing chart of the on-off operation of the switches when the test is carried out by the test circuit of FIG. 2.

First, a description will be made of an embodiment of the invention relating to the method of testing the connection between the connection terminals of the IC chip and the conductive leads of the TAB tape, and the structure of the TAB tape associated with that method, with reference to FIGS. 1, 2 and 3.

Figure 1:
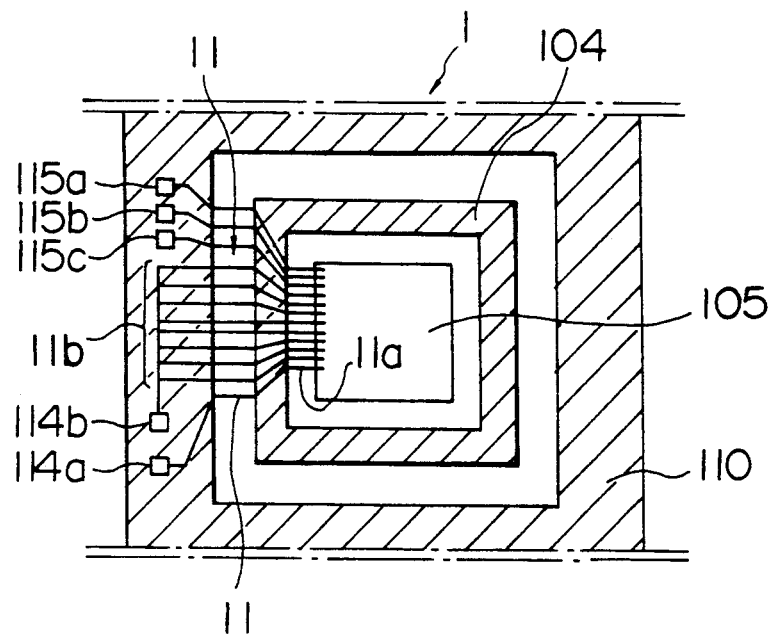
FIG. 1 shows a device for assembly of IC element according to this invention, on which an IC element is mounted and especially shows the test pads relating to the connection test between the conductive leads and the connection terminals of the IC element.
Figure 4:
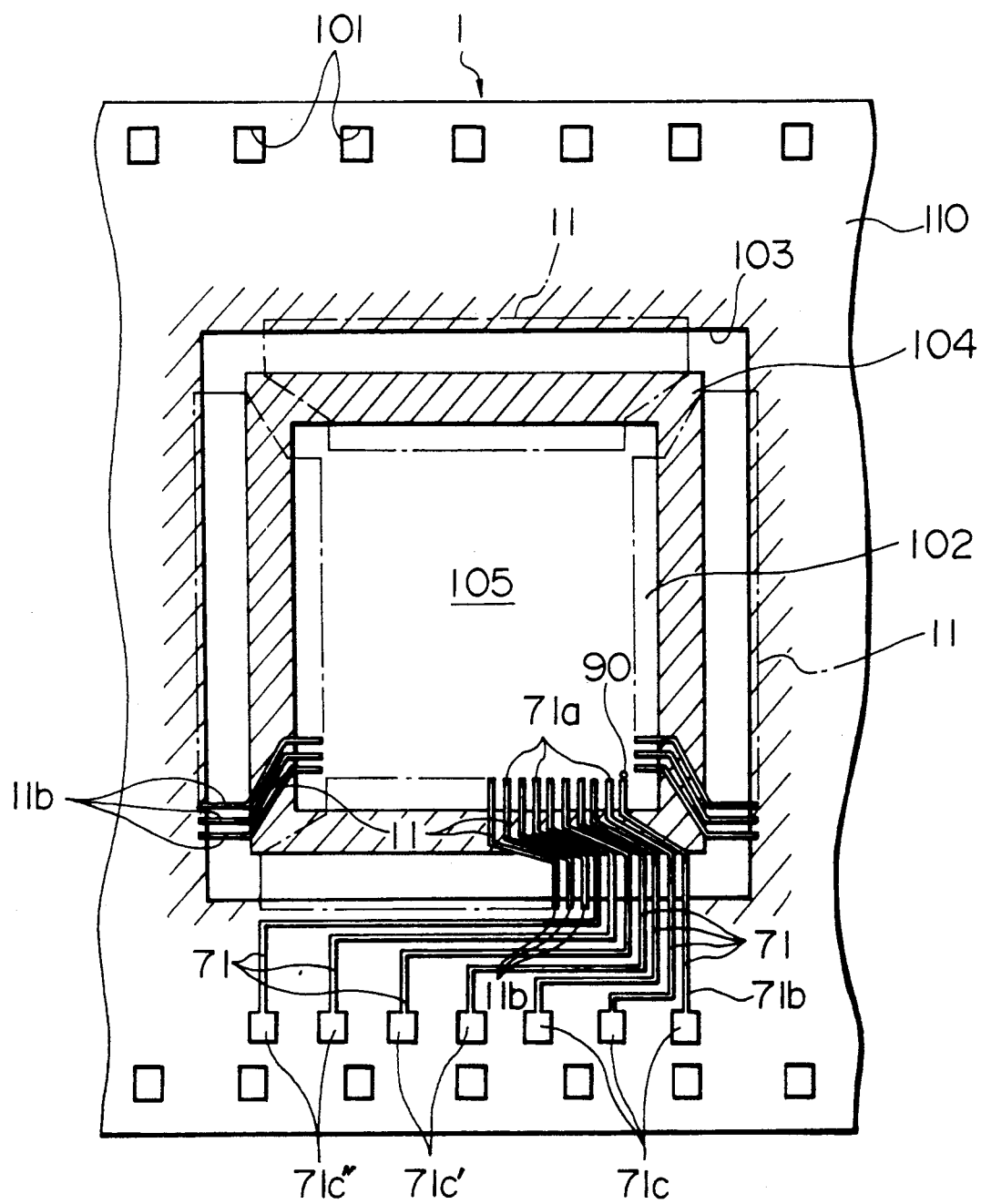
FIG. 4 shows a device for assembly of IC element according to this invention, on which an IC element is mounted and especially shows the test pads relating to the function test of the IC element.

FIG. 1 shows a part of the TAB tape 1 on which an IC element or chip 105 is mounted. The construction of the TAB tape 1 is shown in more detail in FIG. 4. Before describing the embodiment of the present invention as shown in FIG. 1, the construction of the TAB tape will be explained with reference to FIG. 4. As mentioned hereinbefore, the TAB tape 1 has sprocket holes 101 formed at equal intervals along both longitudinal edges of the tape and includes many frames divided lengthwise of the tape 1. Each frame includes, as shown in FIG. 4, a support ring 104 formed with a device hole 102 of substantially rectangular shape in which an IC element or chip 105 is mounted and a marginal area 110 surrounding the support ring 104 formed with an outer lead hole 103 of substantially rectangular shape between the marginal area 110 and the support ring 104.

Referring again to FIG. 1, the inner end portions 11a of the conductive leads 11 printed on the TAB tape 1 are bonded to the connection terminals of the IC chip. It should be noted that test pads are provided to all the outer end portions of the conductive leads in the conventional TAB tape, while in the embodiment of FIG. 1 there are provided only two test pads 114a, 114b and additional test pads 115a, 115b, 115c connected to the conductive leads connected to the power and control terminals of a scan circuit or test circuit. The test pad 114b is connected to all the conductive leads connected to the internal circuits of the IC chip. The structure of the TAB tape 1 is known and the conductive leads 11 are the same as those of the prior art and thus will not be described in detail.

Figure 2:
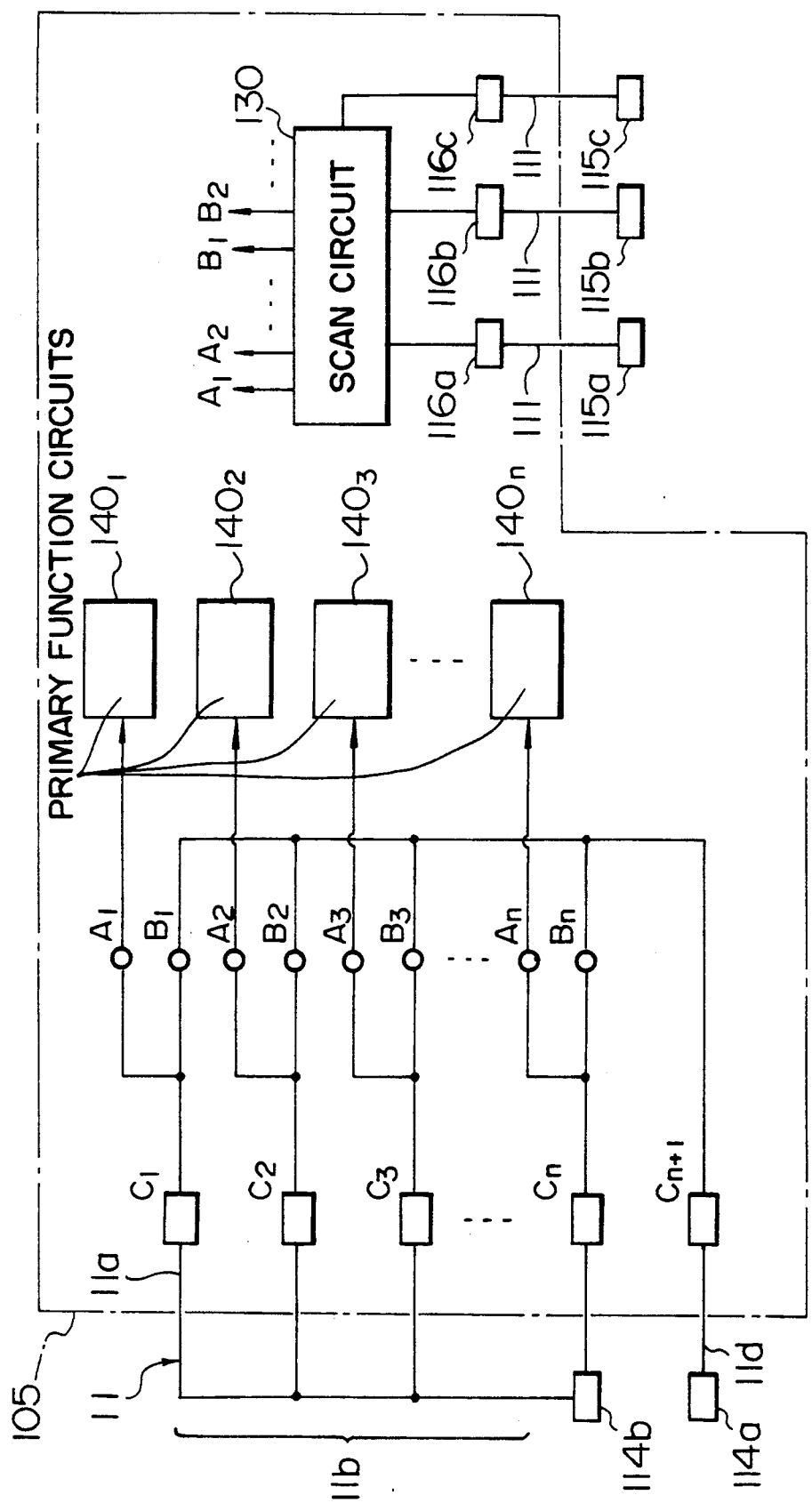
FIG. 2 is a block diagram of a test circuit incorporated in the IC element for the test of electrical connection between the connection terminals of the IC element and the conductive leads used for the method of this invention.

FIG. 2 is a block diagram showing the inner circuits of the IC chip 105 and the connections between test pads 114a, 114b of FIG. 1 and the inner circuits. Referring to FIG. 2, there are shown IC pads (connection terminals) C1, C2, . . . , Cn (where n is the number of pins of the IC) which are connected to the inner end portions 11a of the leads 11, of which the outer end portions 11b are connected to the common test pad 114b, and an IC pad Cn+1 is connected to the inner end portion of the lead 11d which is connected to the test pad 114a. These IC pads are provided around the IC chip 105. Moreover, the IC chip 105 has a test or scan circuit 130, switching gates A1 to An, B1 to Bn and the peripheral circuits preliminarily incorporated therein when the IC chip is produced.

The scan circuit 130 is originally used for scan-testing the IC chip before bonding, and in this embodiment it is so arranged that the connections between the leads 11 and the IC chip 105 can be additionally tested after bonding. The switching gates A1 to An and the switching gates B1 to Bn are sequentially turned on or off by the signals fed from the scan circuit 130 so as to connect the IC pads C1 to Cn to the internal circuits $140_1$ to $140_n$ having the primary functions of the IC chip or to disconnect the pads from the internal circuits. Also, IC pads 116a, 116b for the power supply terminals of the scan circuit 130 are connected through leads 111 to test pads 115a, 115b. The operation of the scan circuit 130 is controlled by a control signal fed from the outside through the test pad 115c, lead 111 and IC pad 116c. The test pads 115a, 115b and 115c are formed on the margin area 110 of the TAB 1 in the same manner as the test pads 114a, 114b. The structures of the leads 111 and IC pad 116c are the same as those of the leads 11 and pads C1 to Cn.

Although not shown in FIG. 2, the IC chip 105 is also provided with a circuit means for energizing and operating scan test before bonding. However, this circuit means is not directly related to the test of the connections of the IC pads before bonding, and thus will not be described here.

The procedure for testing the connection conditions after bonding will be described below. First, a start signal is applied to the scan circuit 130 from a suitable outside device (not shown) through the test pad 115c, so that the scan circuit 130 starts a test sequence according to a predetermined program. In this test sequence, first the switching gates A1 to An are all turned off to disconnect the IC pads C1 to Cn from the circuits $140_1$ to $140_n$. Then, the scan circuit 130 supplies a signal sequentially to the switching gates B1 to Bn so that as shown in FIG. 3 the switching gates B1 to Bn are turned on in a predetermined order. When the switching gate B1 is on, the test pad 114a is conditioned to be connected to the test pad 114b through the IC pad Cn+1, switching gate B1 and IC pad C1. Under this condition, the bonding conditions of the IC pads C1 and Cn+1 and the breakage of the corresponding lead 11 can be detected by checking the conduction between the test pads 114a and 114b. Similarly, the bonding conditions of the IC pads C2 to Cn and the breakage of the corresponding leads 11 can be detected by sequentially turning on the switching gates B2 to Bn.

Thus, by using the scan circuit 130 in a manner as above-mentioned for the connection test after bonding of the IC chip 105 to the TAB tape 2, the test pads necessary for test after bonding are only five pads 114a, 114b, 115a, 115b and 115c, and the test for the bonding conditions of all the IC pads can be made by using these five test pads. Therefore, as compared with the prior art in which a test pad is provided for each of the outer end portions of all the leads 11, in the present invention the number of necessary test pads is very small.

Figure 5:
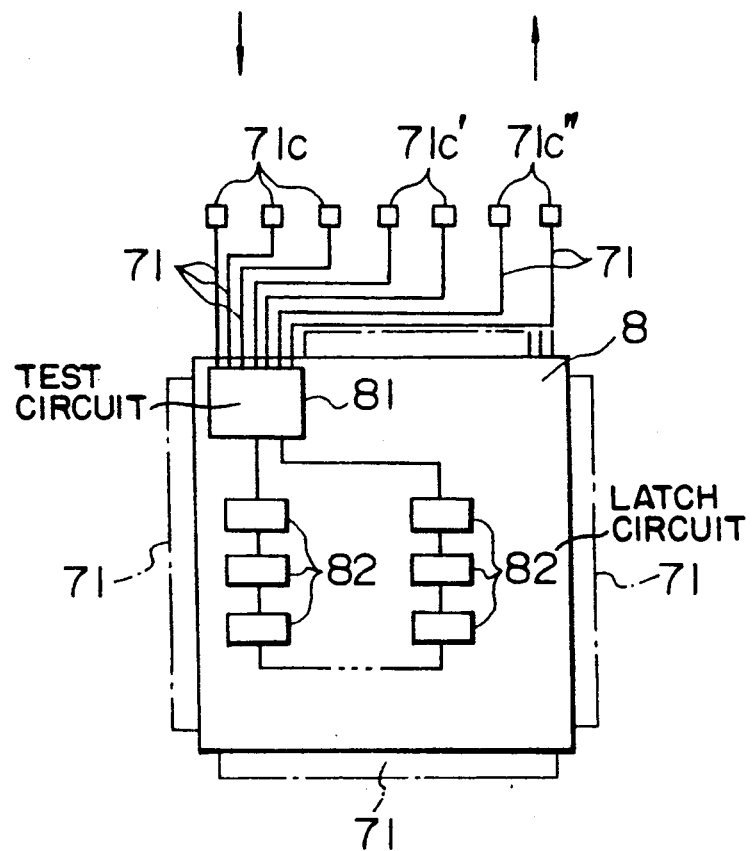
FIG. 5 is a block diagram showing a test circuit of the IC element in the embodiment of FIG. 4.

The embodiment of this invention relating to the method of testing the functions of the IC chip and the structure of the TAB tape associated therewith will be described with reference to FIGS. 4 and 5.

The test for the functions of the IC chip is performed by using a self-test circuit incorporated in the IC chip. This circuit, as shown in FIG. 5, includes a test circuit 81 and latch circuits connected in a loop to the test circuit 81 so as to sequentially check the internal circuits. In the illustrated embodiment, the test circuit 81 is connected through seven conductive leads 71 to three test pads 71c, two test pads 71c' and two test pads 71c'', respectively, provided on the TAB tape 1. A power source is connected through the test pads 71c' to the test circuit 81, a control signal for making test is fed through the test pads 71c to the test circuit 81 and the test results are judged based on an output signal produced from the test pads 71c''.

The conductive leads 71 and test pads 71c, 71c', 71c'' associated with the test for the functions of the IC chip are formed on the TAB tape 1 as shown in FIG. 4. The inner end portions 71a of the conductive leads 71, which are supported on a support ring 104 of the TAB tape 1, are bonded to projected electrodes (bumps) 90 (only one thereof is shown) of the IC chip 105 placed in a device hole 102 defined by the support ring 104. The bumps are connected to the test circuit 81. The outer end portions 71b of the conductive leads 71 are connected to the test pads 71c, 71c', 71c'' provided on the TAB tape. These test pads are formed on the margin area 110 of the TAB tape with equal spaces therebetween and the size of each pad and the space between the pads are large enough for satisfactory reliability of the test to be made which will be mentioned later.

The IC chip 105 in this embodiment, includes, though not shown in FIG. 4, the same logic circuits as the logic circuits 140 for executing the primary functions of the IC chip as shown in FIG. 2. The outer end portions of the conductive leads 11 connected to those logic circuits are terminated on the outer peripheral edge of the outer lead hole 103.

To perform testing, a test instrument is connected to the test pads 71c, 71c', 71c'', a power supply is connected through the pads 71c' to the test circuit 81, and a test pattern signal is supplied through the pads 71c thereto. The test circuit 81 sequentially scans the loop circuits 82 in accordance with the test pattern signal. Thus, the data representing the states of the internal logic circuits (not shown) are produced from the pads 71c'' and the states of the logic circuits can be judged by analyzing the data.

In the embodiment relating to the test for the functions of the IC chip, since only seven test pads corresponding to the number of the conductive leads connected to the test circuit 81 are provided on the TAB tape, the size of each test pad and the space between the test pads can be freely determined by considering the reliability of the test. Moreover, since the seven test pads are substantially aligned along one side of each frame of the TAB tape, they can be easily connected to the test equipment. The number of the test pads is determined by the construction of the test circuit within the IC chip, and thus in order that the TAB tape can be used common to various different IC chips, the number of the test pads to be provided on the TAB tape can be decided depending on the expected maximum number of terminals of the test circuit of any IC chip to be assembled.

The test for the functions of the IC chips and the test for the connections between the conductive leads and the connection terminals have been mentioned separately. However, both these tests are normally made after the IC chips are bonded to the TAB tape, and hence it is desired that the TAB tape have such structure as to be suited for both these tests. For this purpose, it is desirable that all the test pads for both the tests are formed on each frame of the TAB tape and the test pads 114a, 114b, 115a, 115b and 115c for the connection test are formed along one side of the frame as shown in FIG. 1, and that the test pads 71c, 71c' and 71c'' for the function test are formed a different side of the frame as shown in FIG. 4.

Figure 6:
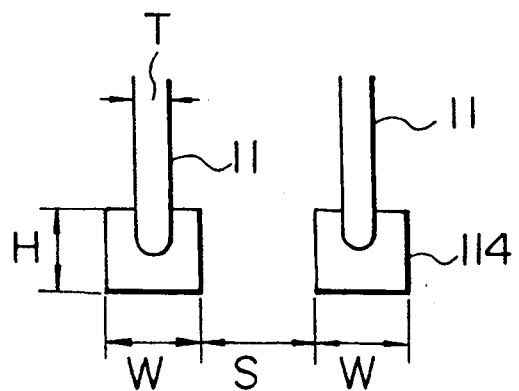
FIG. 6 is an explanatory diagram for explaining the size and space of the test pads.

When the test pads are arranged in line as above, the size of each pad and the space between the test pads are determined such that the space necessary for the test pads is made as small as possible so long as the tests can be performed with satisfactory ease and reliability. The dimensions of the conductive lead and the test pad as defined in FIG. 6 are as follows: the width T of the conductive lead is 50 to 150 $\mu$m, average 100 $\mu$m, and the length H and width W of the test pad 114 are approximately 300 $\mu$m and 500 $\mu$m, respectively which may be the same as those in the prior art. The size of the test pad is made at least larger than the outer end portion of the conductive lead. According to this invention, the number of the test pads is limited as mentioned above, so that the space S between the test pads can be much increased without increasing the space of the margin area of the TAB tape. For example, the space S between the test pads can be 500 $\mu$m or above, thereby increasing the reliability.

We claim:

1. An apparatus for assembly and testing of an IC element having a first section designated for primary functions of the IC element and a second section designated for testing of the IC element, said apparatus comprising:
   a substrate made of a film of insulating material and having an IC-mounting portion defining a position of an IC element to be assembled;
   a plurality of first leads mounted on the substrate and connected to the first section of an IC element when mounted to the IC-mounting portion;
   a plurality of second leads connected to the second section of the IC element;
   a single first test pad for connection of the first leads thereto;
   second test pads for connection of the respective second leads thereto; and
   means for connecting said first leads to at least one of said second leads when testing the IC element through said first and second pads.

2. An apparatus according to claim 1, wherein said first and second test pads are designated for testing of connection between said first leads and the first section of the IC element.

3. An apparatus according to claim 2, wherein said mounting portion is substantially rectangular and said first and second test pads are arranged at a periphery of said rectangular IC mounting portion.

4. An apparatus according to claim 1, wherein said first and second test pads are designated for testing of connection between said first and second leads and the IC element.

5. An apparatus according to claim 1, wherein said first and second test pads include a first group of pads designated for testing of connection of said firs leads to the first section of the IC element and a second group of pads designated for testing of the primary functions of the IC element.

6. An apparatus according to claim 5, wherein said mounting portion is substantially rectangular, said firs group of pads is disposed along one side of said rectangular IC mounting portion, and said second group of pads is disposed along a different one side of said rectangular IC mounting portion.

7. An apparatus according to claim 1, wherein said first and second test pads include a first group of pads designated for testing of the primary functions of the IC element.

8. An apparatus according to claim 7, wherein said IC mounting portion is substantially rectangular, said first group of pads is substantially aligned along one side of said rectangular IC mounting portion, and said second group of pads is disposed along a different one side of said rectangular IC mounting portion.

9. An apparatus for interconnection of an IC element having first circuit means performing primary functions of the IC element, second circuit means for self-testing the IC element, first connection terminals for connecting the first circuit means to an external device, and second connection terminals relating to the self-test circuit means, said apparatus comprising:
   a substrate made of a film of insulating material and having an IC-mounting portion defining a position for mounting an IC element to be connected;
   a plurality of first leads connected to the first connection terminals of the IC element as mounted to the IC-mounting portion;

a plurality of second leads connected to the second connections terminals of the IC element;

a first test pad connected to the first leads;

a plurality of second test pads connected to the second leads; and means for connecting said first leads to at least one of said second leads for testing the IC element through said first and second pads.

* * * * *